(12) United States Patent
Kerner

(10) Patent No.: US 10,537,045 B2
(45) Date of Patent: Jan. 14, 2020

(54) DEVICE COMPRISING A TUBULAR COOLER AND AN ELECTRONIC HOUSING

(71) Applicant: CONTINENTAL AUTOMOTIVE GMBH, Hannover (DE)

(72) Inventor: Nikolaus Kerner, Wenzenbach (DE)

(73) Assignee: Continental Automotive GmbH, Hannover (DE)

( * ) Notice: Subject to any disclaimer, the term of this patent is extended or adjusted under 35 U.S.C. 154(b) by 0 days.

(21) Appl. No.: 15/762,346

(22) PCT Filed: Aug. 25, 2016

(86) PCT No.: PCT/EP2016/070069
§ 371 (c)(1),
(2) Date: Mar. 22, 2018

(87) PCT Pub. No.: WO2017/050519
PCT Pub. Date: Mar. 30, 2017

(65) Prior Publication Data
US 2018/0303010 A1 Oct. 18, 2018

(30) Foreign Application Priority Data
Sep. 23, 2016 (DE) ......................... 10 2015 218 303

(51) Int. Cl.
*H05K 7/20* (2006.01)
*H05K 5/02* (2006.01)
*H05K 5/00* (2006.01)

(52) U.S. Cl.
CPC ....... *H05K 7/20881* (2013.01); *H05K 5/0217* (2013.01); *H05K 5/0069* (2013.01)

(58) Field of Classification Search
CPC .......... H05K 7/20881; H05K 7/20872; H05K 5/0217; H05K 5/0069; H05K 7/20327;
(Continued)

(56) References Cited

U.S. PATENT DOCUMENTS 3,127,530 A 3/1964 White
5,457,603 A 10/1995 Leeb
(Continued)

FOREIGN PATENT DOCUMENTS

DE 102005036299 A1 2/2007
WO 2004085209 A1 10/2004
(Continued)

*Primary Examiner* — Jayprakash N Gandhi
*Assistant Examiner* — Stephen S Sul
(74) *Attorney, Agent, or Firm* — Laurence A. Greenberg; Werner H. Stemer; Ralph E. Locher

(57) ABSTRACT

A device has an electronics housing and a tube cooler with a tube formed in one piece from a single material. The tube has a tube coil and a first tube portion, between which the electronics housing is arranged, and a first connecting portion. The first connecting portion fluidically connects the first tube portion to a first side of the tube coil. The first tube portion is connectable to a coolant supply and arranged laterally offset with respect to the tube coil. The tube coil and the first tube portion extend on a common side of the first connecting portion. The first connecting portion is inclined with respect to the tube coil and to the first tube portion and/or is curved from the tube coil to the first tube portion.

16 Claims, 6 Drawing Sheets

(58) Field of Classification Search
CPC .......... H05K 7/20845; H05K 7/20927; H05K 7/20218–7/20272; H01L 23/473; H01F 27/10
USPC .............. 361/699, 689, 707, 719, 721, 722; 165/80.4–80.5, 104.33
See application file for complete search history.

(56) References Cited

U.S. PATENT DOCUMENTS

| | | | |
|---|---|---|---|
| 5,923,533 | A | 7/1999 | Olson |
| 6,016,251 | A | 1/2000 | Koide et al. |
| 6,542,365 | B2 * | 4/2003 | Inoue .................. H01L 23/4006 165/80.4 |
| 6,979,772 | B2 | 12/2005 | Meng-Cheng et al. |
| 7,684,195 | B2 | 3/2010 | Kerner et al. |
| 7,729,117 | B2 * | 6/2010 | Schweinbenz ..... H05K 7/20872 165/104.19 |
| 2001/0036061 | A1 | 11/2001 | Donahoe et al. |
| 2002/0166519 | A1 * | 11/2002 | Skrzypchak .............. F01P 3/12 123/41.31 |
| 2003/0056491 | A1 * | 3/2003 | Coleman ............ F02D 41/3005 60/39.281 |
| 2007/0268669 | A1 * | 11/2007 | Attlesey .................. G06F 1/185 361/699 |
| 2008/0212281 | A1 * | 9/2008 | Kerner ................ B60R 16/0239 361/701 |
| 2009/0231811 | A1 * | 9/2009 | Tokuyama .............. H01L 23/36 361/699 |
| 2010/0252234 | A1 * | 10/2010 | Cambell ............... H01L 23/473 165/80.2 |
| 2014/0048111 | A1 * | 2/2014 | Hinsperger ............. H01L 35/30 136/201 |
| 2014/0069615 | A1 * | 3/2014 | Kusaka .................. H01L 23/473 165/104.19 |
| 2014/0238516 | A1 * | 8/2014 | Demange ........... H05K 7/20781 137/599.01 |
| 2015/0282383 | A1 * | 10/2015 | Singh .................... H05K 1/021 361/689 |
| 2016/0234975 | A1 | 8/2016 | Lim et al. |

FOREIGN PATENT DOCUMENTS

| | | |
|---|---|---|
| WO | 2007014801 A2 | 2/2007 |
| WO | 2015037824 A1 | 3/2015 |

* cited by examiner

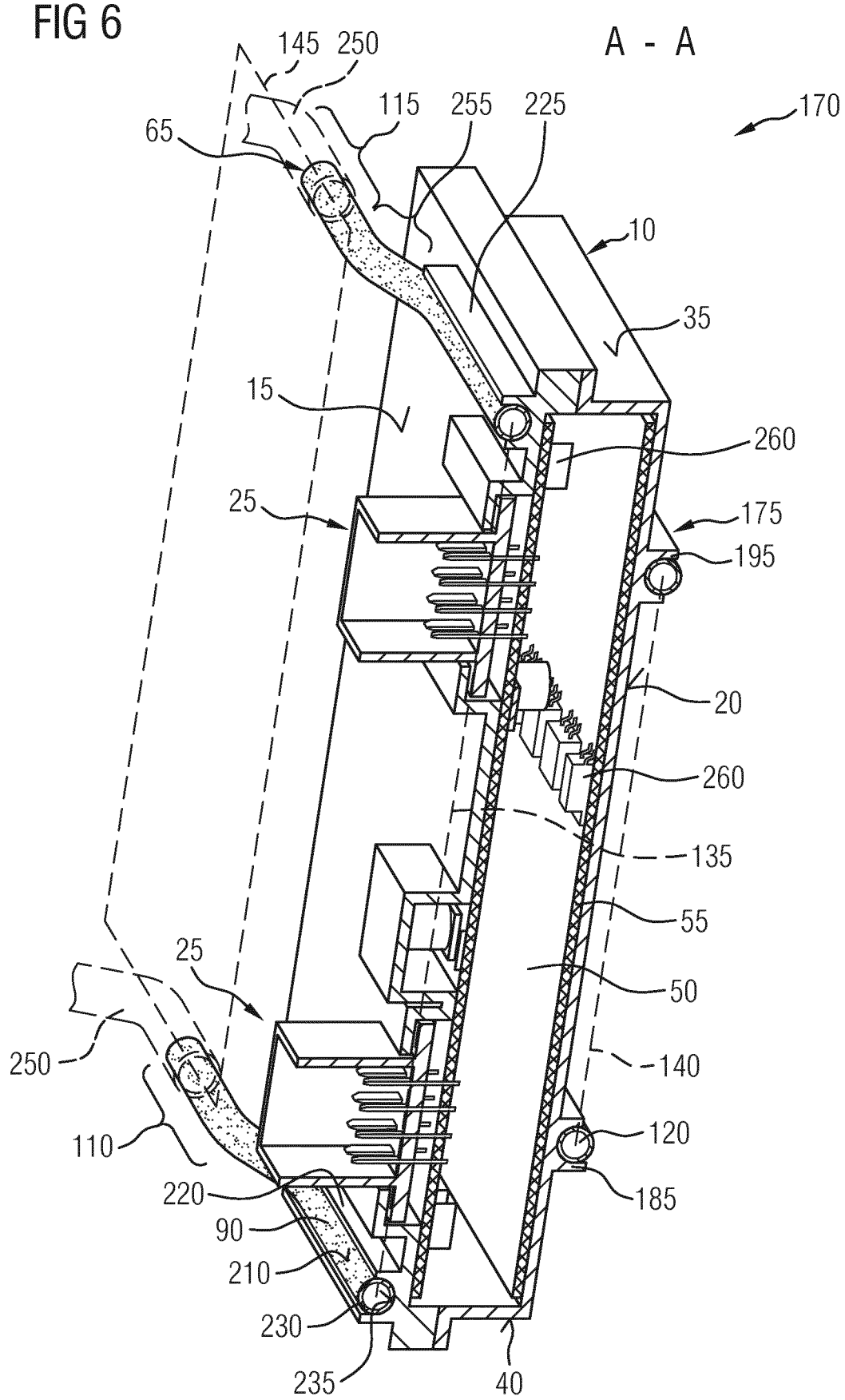
FIG 6  A - A

DEVICE COMPRISING A TUBULAR COOLER AND AN ELECTRONIC HOUSING

BACKGROUND OF THE INVENTION

Field of the Invention

The invention relates to a tube cooler and to a device having a tube cooler and an electronics housing.

U.S. Pat. No. 6,016,251 discloses a printed circuit board and a cooling device for cooling the printed circuit board.

SUMMARY OF THE INVENTION

The object of the invention is to provide an improved device having a tube cooler and an electronics housing.

This object is achieved by means of a device according to the independent claim. Advantageous embodiments and developments can be gathered from the dependent claims, the following description and the drawings.

According to one aspect of the present disclosure, a device having an electronics housing and a tube cooler is specified. According to a further aspect, a tube cooler for an electronics housing is specified.

It has been found that an improved tube cooler for an electronics housing can be provided in that the tube cooler has a tube formed in one piece from a single material. The tube is fillable with a coolant. The tube comprises a tube coil, a first tube portion and a first connecting portion. The first tube portion is connectable to a coolant supply for feeding the coolant. The first connecting portion fluidically connects the first tube portion to a first side of the tube coil.

The first tube portion is arranged in a laterally offset manner with respect to the tube coil. This means in particular that the first tube portion is offset with respect to the tube coil, in plan view, along the distance vector between the first tube portion and tube coil in a direction perpendicular to a main direction of extent of the first tube portion.

The electronics housing is arrangeable between the first tube portion and the tube coil, wherein the tube coil and the first tube portion extend on a common side of the first connecting portion. The fact that the tube coil and the first tube portion extend on a common side of the first connecting portion means in particular that the first tube portion and the tube coil extend into the same half space starting from their connection region to the first connecting portion. The half space is defined in particular by a plane which extends parallel to the distance vector between the first tube portion and tube coil and perpendicularly or in an inclined manner with respect to the main direction of extent of the first tube portion.

The electronics housing has a top side and an underside arranged in an offset manner with respect to the top side. Put another way, the top side and the underside are located on opposite sides from one another, in particular such that an interior of the electronics housing is bounded on opposite sides by the top side and the underside. In other words, the top side and the underside bound the electronics housing in mutually opposite spatial directions. The tube coil is assigned to the underside of the electronics housing and the first tube portion is assigned to the top side of the electronic housing. Put another way, the tube coil extends along the underside of the electronics housing and the first tube portion extends along the top side of the electronics housing. The first connecting portion is guided laterally past the electronics housing.

The connecting portion is arranged in an inclined manner—in particular partially or along its entire length—with respect to the tube coil and to the first tube portion. It can also extend in a curved manner—partially or along its entire length—from the tube coil to the first tube portion.

In this way, two sided removal of heat from the electronics housing by the tube cooler can be ensured. Furthermore, leaks of the tube can be avoided. The tube cooler is mountable on the electronics housing particularly easily, in particular by means of the tube cooler being pushed onto the electronics housing in a direction parallel to the main planes of extent of the top side and underside.

In a further embodiment, the tube has a second tube portion and a second connecting portion. The second connecting portion fluidically connects the second tube portion to a second side of the tube coil.

The second tube portion is arranged in a laterally offset manner with respect to the tube coil, wherein the tube coil and the second tube portion extend on a common side of the second connecting portion. The fact that the second tube portion is arranged in a laterally offset manner with respect to the tube coil means in particular that the second tube portion is offset with respect to the tube coil, in plan view, along the distance vector between the second tube portion and tube coil in a direction perpendicular to a main direction of extent of the second tube portion. The fact that the tube coil and the second tube portion extend on a common side of the second connecting portion means in particular that the second tube portion and the tube coil extend into the same half space starting from their connection region to the second connecting portion. The half space is defined in particular by a plane which extends parallel to the distance vector between the second tube portion and tube coil and perpendicularly or in an inclined manner with respect to the main direction of extent of the second tube portion. It is preferably the same half space as the one into which the first tube portion and the tube coil extend.

The second connecting portion is arranged in an inclined manner—in particular partially or along its entire length—with respect to the tube coil and to the second tube portion. It can also extend in a curved manner—partially or along its entire length—from the tube coil to the second tube portion.

In a further embodiment, the tube coil is arranged in a first main plane of extent and the first tube portion is arranged in a second main plane of extent. The electronics housing is in particular arrangeable between the first and second main planes of extent. The first main plane of extent is arranged parallel to the second main plane of extent.

In a further embodiment, the second tube portion is arranged in the second main plane of extent. Preferably, the second tube portion is arranged parallel to the first tube portion. As a result, the tube cooler can be bent particularly easily out of the tube formed in one piece from a single material.

In a further embodiment, the first connecting portion and the second connecting portion are arranged in a common third main plane of extent. Preferably, the second connecting portion is arranged in an inclined manner with respect to the first connecting portion, specifically in particular in the third main plane of extent. As a result of the common arrangement in the third main plane of extent, the tube cooler is formed in an open manner toward one side—located opposite the third main plane of extent. As a result, the tube cooler can be pushed onto the electronics housing particularly easily. Furthermore, the two-sided cooling of the electronics housing is ensured.

In a further embodiment, the first connecting portion is arranged perpendicularly at least partially to the first tube portion and/or at least partially to the tube coil. As a result, a particularly compact configuration of the tube cooler can be ensured.

In a further embodiment, the tube coil has a first tube coil portion, a second tube coil portion and at least one third tube coil portion. The second tube coil portion fluidically connects the first tube coil portion to the third tube coil portion, in particular on a side of the first tube coil portion facing away from the first connecting portion. The first tube coil portion is arranged at least partially parallel to the third tube coil portion. Preferably, the second tube coil portion is arranged at least partially at right angles to the first and/or third tube coil portion. As a result, a particularly compact tube coil that is U-shaped, in particular in plan view onto the first main plane of extent, can be formed, which ensures a high level of heat dissipation.

In a further embodiment, the first tube portion and/or the second tube portion is arranged parallel to the first tube coil portion and/or to the third tube coil portion. As a result, the tube cooler can be bent particularly easily.

In a further embodiment, the first tube coil portion and the third tube coil portion are at a first spacing from one another. The first tube portion and the second tube portion are at a second spacing from one another. The second spacing is different than the first spacing. Preferably, the second spacing is greater than the first spacing.

In a further embodiment, the tube comprises a connection portion, wherein the connection portion is fluidically connected to the first tube portion. The connection portion is arranged in an offset manner with respect to the first tube portion in the direction of the side facing away from the tube coil. As a result, the tube cooler can be connected to the coolant supply particularly easily via the connection portion.

In a further embodiment, the connection portion of the tube cooler is arranged in a manner spaced apart from the top side of the electronics housing. As a result, a particularly easily accessible connection possibility for connecting the pipe cooler to the coolant supply is ensured.

The above-described properties, features and advantages of this invention and the manner in which they are achieved will become clearer and more distinctly comprehensible in connection with the following description of the exemplary embodiments, which will be discussed in more detail in connection with the drawings, in which:

BRIEF DESCRIPTION OF THE SEVERAL VIEWS OF THE DRAWING

FIG. 6 shows a sectional view along a section plane A-A, shown in FIG. 5, through the device.

DESCRIPTION OF THE INVENTION

Figure 1:
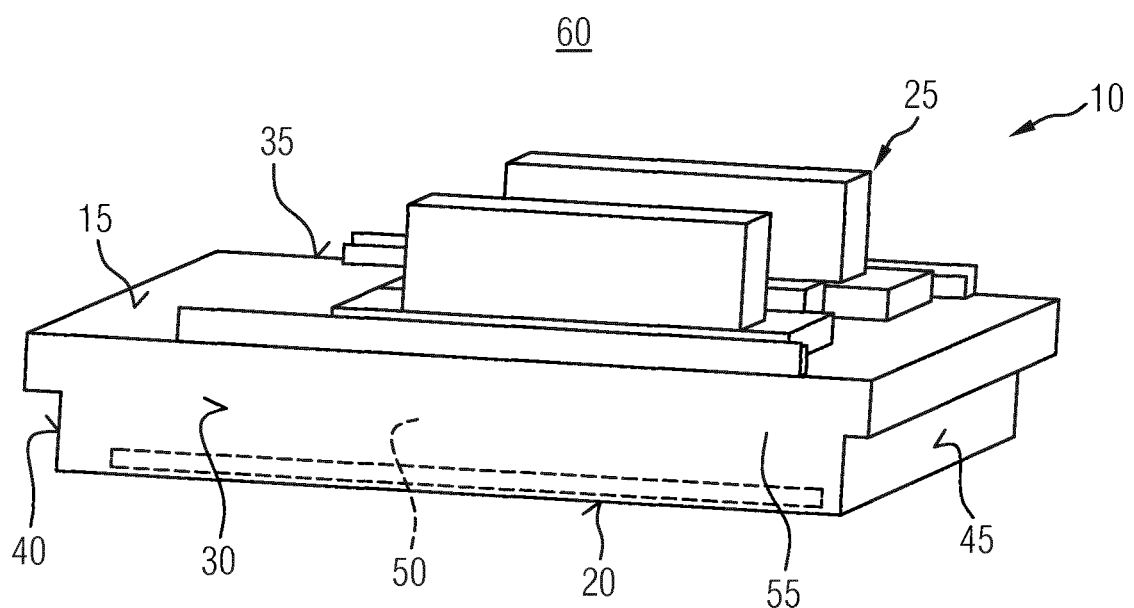
FIG. 1 shows a perspective view of an electronics housing.

FIG. 1 shows a perspective view of an electronics housing 10. The electronics housing 10 has a substantially rectangular basic shape in plan view. The electronics housing 10 has a top side 15 and an underside 20 arranged on the opposite side from the top side 15. The top side 15 and the underside 20 are formed preferably in a partially planar manner. A plurality of electronics housing connections 25—in particular plug connectors—of the electronics housing 10 preferably project out of the top side 15. Furthermore, the electronics housing 10 has a first side face 30, facing the observer in FIG. 1, and a second side face 35, facing away from the observer in FIG. 1. Furthermore, the electronics housing 10 has a third and fourth side face 40, 45 arranged for example laterally on the left and right in FIG. 1.

The first side face 30 and the second side face 35 are configured preferably in a planar manner and extend preferably parallel to one another. The third side face and the fourth side face 40, 45 may be configured in a stepped manner. In this case, the third and fourth side faces 40, 45 are arranged preferably at right angles to the first and second side faces 30, 35. In this case, the third and fourth side faces 40, 45 extend preferably parallel to one another. The side faces 30, 35, 40, 45 are also arranged at right angles to the top side 15 and to the underside 20. It is also possible for the side faces 30, 35, 40, 45 and the top side 15 and the underside 20 to be oriented in some other way with respect to one another. It is also possible to dispense with the electronics housing connection 25 projecting out of the top side 15. The electronics housing connection 25 can also be arranged in some other position on the electronics housing 10.

The electronics housing 10 encloses an electronics housing interior 50, in which an electronics subassembly 55 (schematically illustrated by dashed lines in FIG. 1) for controlling a component of a motor vehicle is arranged. The electronics subassembly 55 is electrically connected to electronics housing connections 25. The electronics housing 10 is configured preferably in a fluid-tight manner with respect to an environment 60 of the electronics housing 10. During operation of the electronics subassembly 55, the latter generates heat.

The electronics subassembly 55 can be connected electrically to further electric and/or electronic components of a motor vehicle via the electronics housing connection 25.

Figure 2:
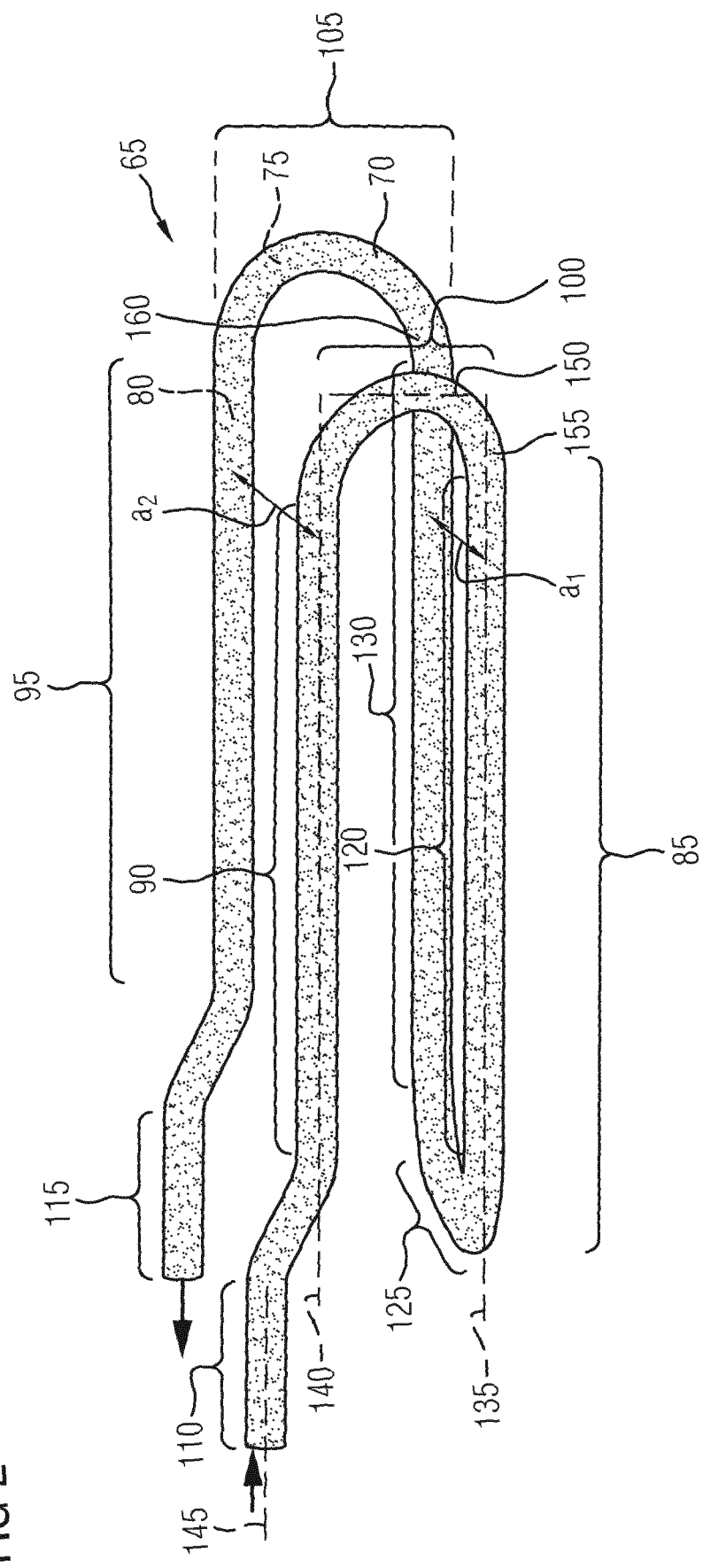
FIG. 2 shows a perspective view of a tube cooler according to one exemplary embodiment.

FIG. 2 shows a perspective view of a tube cooler 65 for the electronics housing 10 shown in FIG. 1. The tube cooler 65 has a tube 70 formed in one piece from a single material. The tube 70 has preferably a circular cross section. The tube 70 bounds a tube interior 75 in which a coolant 80 is arranged. The coolant 80 can be liquid and/or gaseous. In particular, the tube 70 can also be configured as a heat pipe in this case.

The tube 70 has preferably a tube coil 85, a first tube portion 90, a second tube portion 95, a first connecting portion 100, a second connecting portion 105, a first connection portion 110 and a second connection portion 115.

The tube coil 85 has preferably a first tube coil portion 120, a second tube coil portion 125 and a third tube coil portion 130. The tube coil 85 is arranged in a first main plane of extent 135. The first tube coil portion 120 is formed preferably in a rectilinear manner. In the embodiment, the second tube coil portion 125 is arranged preferably at right angles to the first tube coil portion 120 and fluidically connected to the first tube coil portion 120. The third tube coil portion 130 is arranged preferably parallel to the first tube coil portion 120 likewise in the third main plane of extent 150. The third tube coil portion 130 is fluidically connected to the second tube coil portion 125, such that the second tube coil portion 125 fluidically connects the first tube coil portion 120 to the third tube coil portion 130. In the embodiment, the second tube coil portion 125 is formed for example in a rectilinear manner. It is also possible for the second tube coil portion 125 to be configured in a meandering manner. The third tube coil portion 130 is preferably likewise configured in a rectilinear manner. Further configurations of the first, second and third tube coil portion 120, 125, 130 are also conceivable. It is also possible for the second tube coil portion 125 to be arranged in an inclined manner with respect to the first and/or third tube coil portion 120, 130. As a result of the right-angled arrangement of the second tube coil portion 125 and the parallel arrangement of the first and third tube coil portions 120, 130 to one another, the tube coil 85 has a substantially U-shaped basic shape in a plan view onto the first main plane of extent 135.

The first tube portion 90 and the second tube portion 95 are arranged preferably parallel and in an offset manner with respect to one another in a second main plane of extent 140. The second main plane of extent 140 is in this case arranged preferably parallel to the first main plane of extent 135. It is also possible for the second main plane of extent 140 to be arranged in an inclined manner with respect to the first main plane of extent 135. The electronics housing 10 is arrangeable in particular between the first and second main planes of extent 135, 140, wherein for example the housing connections 25 or the like can project beyond the first or second main plane of extent 135, 140.

The first tube portion 90 and the tube coil 85 extend on a common side of the first connecting portion 100. The second tube portion 95 and the tube coil 85 extend on a common side of the second connecting portion 105. Therefore, the tube coil 85 and the tube portions 90, 95 are arranged on the same side with respect to the connecting portions 100, 105.

The first connection portion 110 is arranged preferably parallel to the first tube portion 90 and the second connection portion 115 is arranged parallel preferably to the second tube portion 95. In this case, the connection portion 110, 115 is arranged in an offset manner with respect to the tube portion 90, 95 in the direction of the side facing away from the tube coil 85. Furthermore, the first connection portion 110 and the second connection portion 95 are arranged parallel to one another. The first connection portion 90 and the second connection portion 115 are furthermore arranged in a connection plane 145. The connection plane 145 is arranged preferably parallel to the first and/or second main plane of extent 135, 140, preferably in an offset manner toward a side facing away from the tube coil 85. The first connection portion 110 is connectable to a coolant supply for feeding the coolant 80. The second connection portion 115 can be connected to the coolant supply for draining the coolant 80.

The first connecting portion 100 and the second connecting portion 105 are arranged preferably at least in places in a common third main plane of extent 150. In the present case, they extend in a curved manner from the first or second tube portion 90 or 95 to the tube coil 85, wherein a central region of the first or second connecting portion 100, 105 is arranged in the third main plane of extent 150, which bounds the half space into which the tube coil 85 and first or second tube portion 90, 95 extend starting from the respective connecting portion 100, 105.

The first tube coil portion 120 and the third tube coil portion 130 are at a first spacing $a_1$. The first tube portion 90 and the second tube portion 95 are at a second spacing $a_2$. The second spacing $a_2$ is different than the first spacing $a_1$ and preferably greater than the first spacing $a_1$. As a result, the first connecting portion 100 extends—in projection onto the third main plane of extent 150—in an inclined manner with respect to the second connecting portion 105. It is also possible for the first spacing $a_1$ and the second spacing $a_2$ to be identical. In this configuration, the first connecting portion 100 would then be arranged parallel to the second connecting portion 105.

The first connecting portion 100 can also be arranged in an inclined manner with respect to the first tube portion 90 and to the tube coil 85. The second connecting portion 105 can also be arranged in an inclined manner with respect to the second tube portion 95 and to the tube coil 85. Preferably, the connecting portion 100, 105 is at least partially perpendicular to the tube portion 90, 95 and/or to the tube coil 85.

The first connection portion 110 is fluidically connected to the first tube portion 90. The first tube portion 90 is fluidically connected to the first connecting portion 100. Furthermore, the first connecting portion 100 is connected to an inlet side 155 of the tube coil 85. The inlet side 155 of the tube coil 85 is arranged for example on the first tube coil portion 120 on a side facing away from the second tube coil portion 125. The tube coil 85 has an outlet side 160 on a side of the third tube coil portion 130 that faces away from the second tube coil portion 125. On the outlet side 160, the tube coil 85 is fluidically connected to the second connecting portion 105. In this case, the second connecting portion 105 fluidically connects the tube coil 85 to the second tube portion 95 on the outlet side. The second tube portion 95 is fluidically connected to the second connection portion 115 on a side facing away from the second connecting portion 105.

The coolant 80 is introduced into the tube cooler 65 via the first connection portion 110. The coolant 80 flows into the first tube portion 90 via the first connection portion 110. From the first tube portion 90, the coolant 80 flows into the first connecting portion 100. After flowing through the first connecting portion 100, the coolant 80 passes into the tube coil 85 via the inlet side 155 and in the process flows first of all through the first tube coil portion 120, then through the second tube coil portion 125 and subsequently through the third tube coil portion 130. On the outlet side 160, the coolant 80 passes out of the tube coil 85 into the second connecting portion 105. After flowing through the second connecting portion 105, the coolant 80 passes into the second tube portion 95. After flowing through the second tube portion 95, the coolant 80 flows through the second connection portion 115 and is guided back to the coolant supply via the second connection portion 115.

Figure 3:
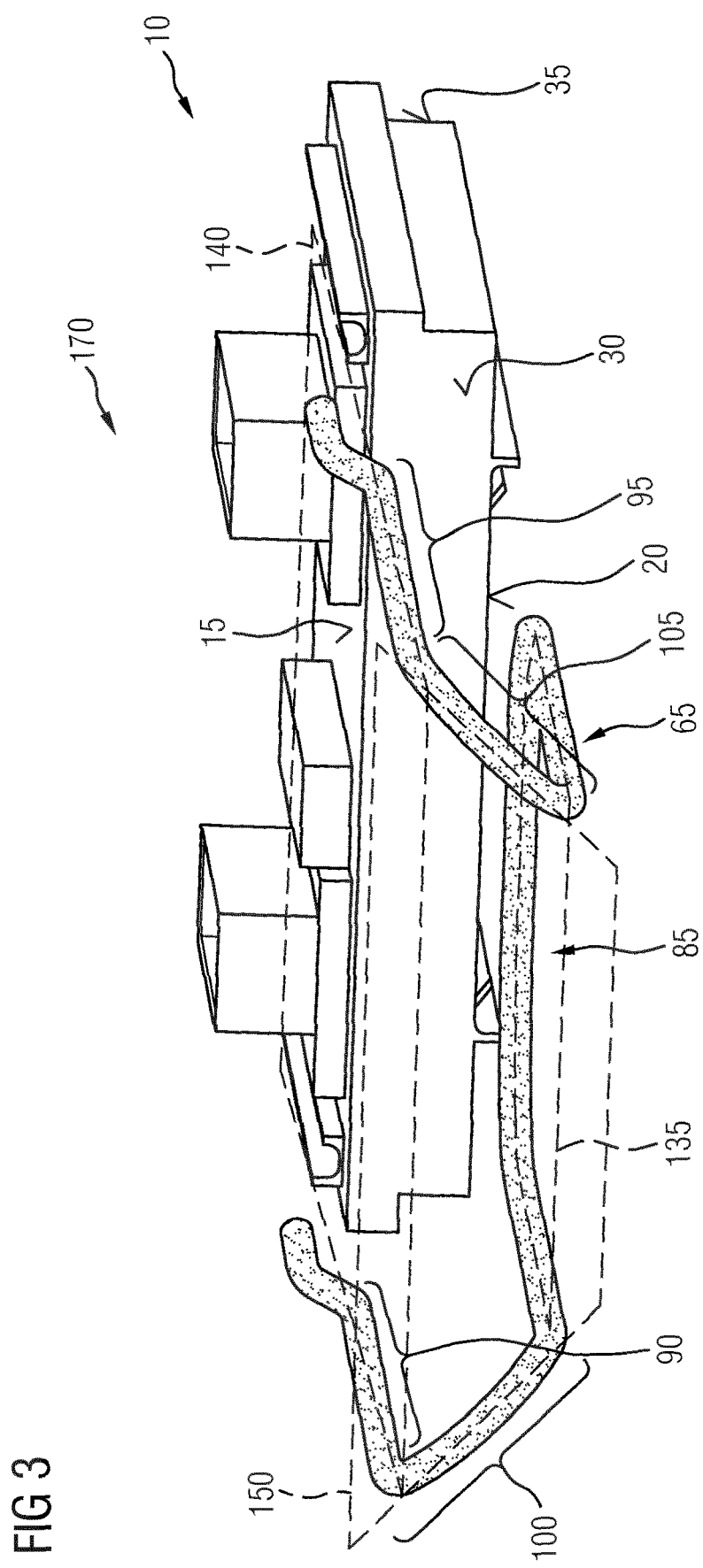
FIG. 3 shows an exploded illustration of a device according to one exemplary embodiment.

FIG. 3 shows an exploded illustration of a device 170 consisting of the electronics housing 10 explained in FIG. 1 and the tube cooler 65 explained in FIG. 2. The exploded illustration corresponds substantially to an arrangement of the tube cooler 65 before it is pushed onto the electronics housing 10. As a result of the offset arrangement of the tube portions 90, 95 in the second main plane of extent 140 with respect to the arrangement of the tube coil 85 in the first main plane of extent 135 and the arrangement of the connecting portions 100, 105 of the common third main plane of extent 150, the tube cooler 65 is open toward the side facing the electronics housing 10.

Figure 4:
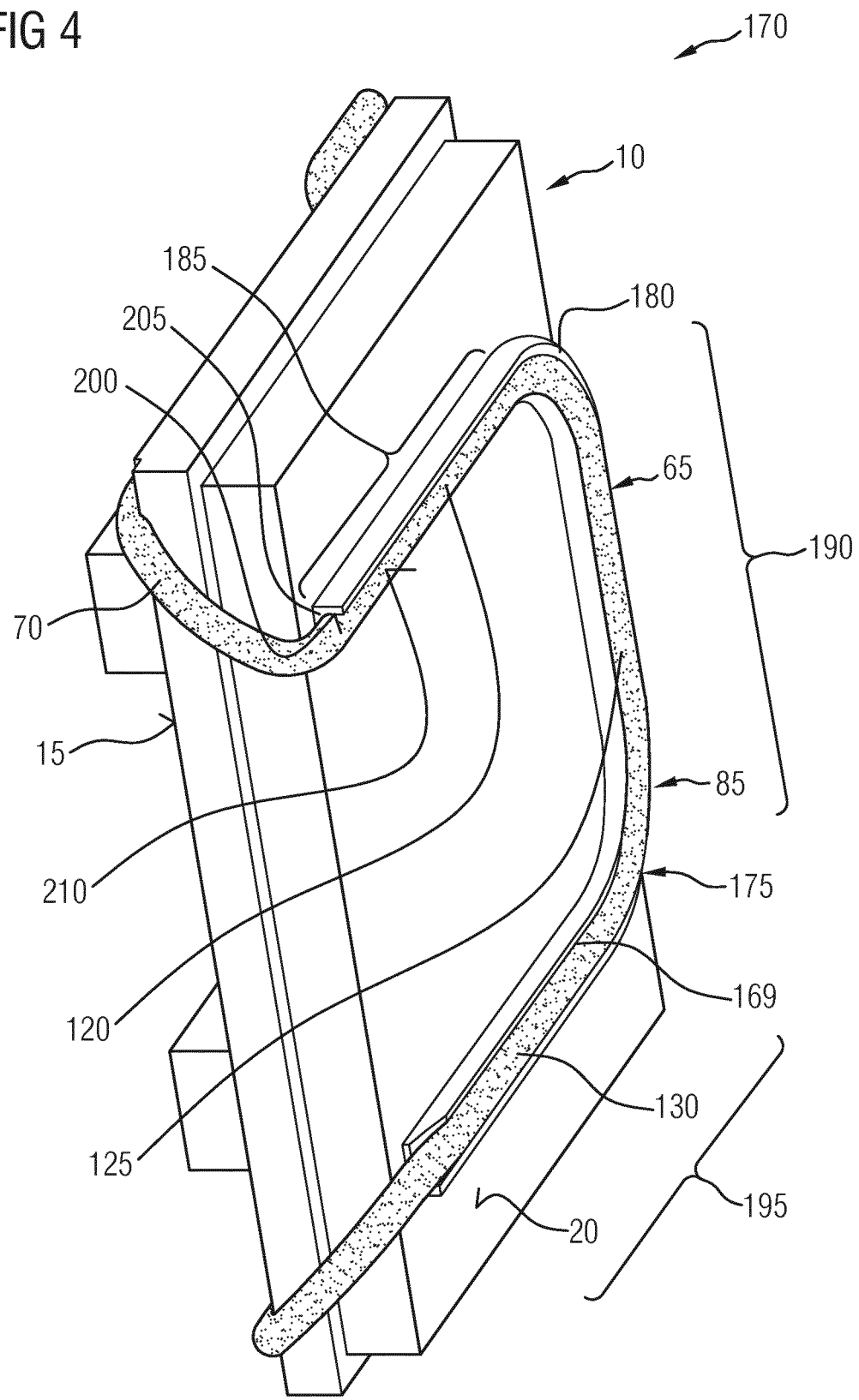
FIG. 4 shows a perspective view of the device.

FIG. 4 shows a perspective view of the device 170 shown in FIG. 3. The tube cooler 65 has been pushed onto the electronics housing 10. Here, the tube coil 85 extends along the underside 20 of the electronics housing 10. The tube coil 85 in this case has first touching contact 169 with the underside 20.

In addition, the electronics housing 10 preferably has a first fastening means 175. The first fastening means 175 is arranged on the underside 20. It is also possible to dispense with the first fastening means 175. The first fastening means 175 has a first rib 180. The first rib 180 is fastened to the underside 20. The first rib 180 has a first rib portion 185, a second rib portion 190 and a third rib portion 195. The first rib portion 185 is arranged in a manner corresponding to the first tube coil portion 120, the second rib portion 190 is arranged in a manner corresponding to the second tube coil portion 125 and the third rib portion 195 is arranged in a manner corresponding to the third tube coil portion 130. Thus, the first rib portion 185 also extends parallel to the third rib portion 195 and the second rib portion 190 is arranged perpendicularly to the first rib portion 185 and to the third rib portion 195.

Formed in the rib portions 185, 190, 195 is a recess 200 which is formed preferably continuously along the first rib 180. The first recess 200 has a first recess face 205. The first recess face 205 is formed in a manner corresponding to an outer circumferential face 210 of the tube coil 85.

The tube coil 85 engages partially into the first recess 200. By means of the first recess 200—running through the rib portions 185, 190, 195—latching of the tube coil 85 in the first recess 200 is reliably ensured. In particular, lateral displacement of the tube cooler 65 on the electronics housing 10 is avoided as a result of the first rib portion 185 and the third rib portion 195. Removal of the tube cooler 65 from the electronics housing 10 is avoided as a result of the second rib portion 190. It is particularly advantageous here for the first recess 200 to be formed in a substantially semicircular manner. Furthermore, as a result of the corresponding configuration of the first recess face 205 and the outer circumferential face 210 of the tube 70, good heat transfer between the electronics housing 10 and the tube cooler 65 is ensured. As a result, the electronics 55 can be cooled particularly well in the electronics housing 10.

Furthermore, it is also conceivable for the first fastening means to have further elements in order to fix the tube cooler 65 to the electronics housing 10. Furthermore, it is possible to dispense with the first fastening means 175. It also possible for the first fastening means 175 shown in FIG. 4 to be configured in some other way.

It is also possible to dispense with the first rib 220, 225, such that the tube coil 85 bears directly against the underside 20 of the electronics housing 10. It is also possible for the first recess 200 to be arranged directly in the electronics housing 10 on the outer side of the underside 20.

Figure 5:
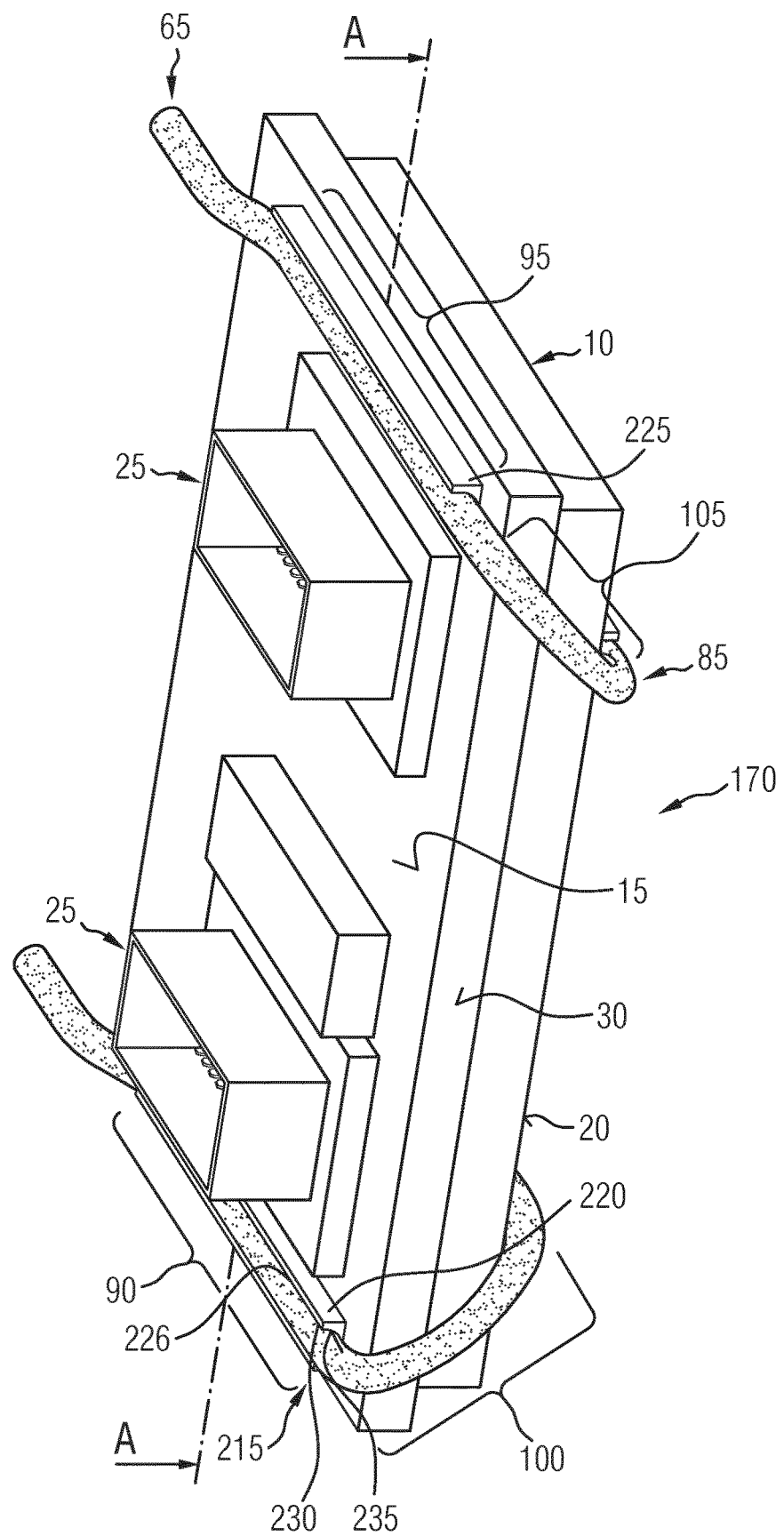
FIG. 5 shows a further perspective view of the device.

FIG. 5 shows a perspective view of the device 170 shown in FIG. 4, in which the tube cooler 65 has been pushed onto the electronics housing 10. As a result of the configuration of the tube cooler 65 open on one side, the first connecting portion 100 and the second connecting portion 105 are guided past the first side face 30, such that the connecting portions 100, 105 can fluidically connect the tube portions 90, 95 arranged on the top side 15 to the tube coil 85 arranged on the underside 20.

In the present embodiment, the electronics housing connection 25 is arranged for example between the first tube portion 90 and the second tube portion 95. It is of course possible, when two electronics housing connections 25 are provided (as shown in FIG. 5), for the first and/or the second tube portion 90, 95 to be guided between the two electronics housing connections 25.

Furthermore, preferably a second fastening means 215 is provided on the electronics housing 10. The second fastening means 215 has a second rib 220 and a third rib 225. The second rib 220 and the third rib 225 are fastened to the top side 15 of the electronics housing 10. In this case, the second rib 220 is arranged preferably parallel to the third rib 225. In this case, the arrangement of the second rib 220 is preferably in a manner corresponding to the first tube portion 90 and the third rib 225 is arranged in a manner corresponding to the second tube portion 95.

The second rib 220 has a second recess 230 with a second recess face 235. The second recess 230 is formed preferably in a substantially semicircular manner corresponding to the outer circumferential face 210 of the first tube portion 90. As a result, planar second touching contact 226 between the first tube portion 90 and the second rib 220 is ensured. As a result, good top-side heat dissipation out of the electronics housing 10 and thus good top-side cooling of the electronics 55 is ensured.

The third rib 225 is formed in a similar manner to the second rib 220. The third rib 225, too, has a third recess 240 with a third recess face 245. The third recess face 245 is formed in a manner corresponding to the outer circumferential face 210 of the tube 70. As a result, planar third touching contact 227 between the second tube portion 95 and the third rib 225 is ensured. The third recess 240 is also formed preferably in a substantially semicircular manner.

As a result of the second and third recesses 230, 240, lateral displacement of the tube portions 90, 95 and thus of the tube cooler 65 is avoided on the top side. In this way, a secure fit of the tube cooler 65 and easy pushing of the tube cooler 65 onto the electronics housing 10 are reliably ensured. As a result, the assembly costs for the device 170 can be kept low. In particular, it is preferably possible to dispense with further fastening means.

It is also possible for the tube portion 90, 95 to bear directly against the top side 15 of the electronics housing 10. It is also possible for the second and/or third recess 230, 240 to be arranged directly in the electronics housing 10 on the outer side of the top side 15.

FIG. 6 shows a sectional view along a section plane A-A shown in FIG. 5.

As a result of the offset of the connection plane 145 with respect to the first and second main planes of extent 135, 140, easier pushing of a hose line 250 onto the connection portion 110, 115 can be ensured. It is also possible for the connection plane 145 to be arranged in the first main plane of extent 135.

In FIGS. 1 to 6, the tube 70 has arcuate regions 255 between the tube portions 90, 95, tube coil portions 120, 125, 130, connecting portions 100, 105 and/or connection portions 110, 115. Said arcuate regions 255 serve to avoid kinking of the tube 70 when it is bent out of a continuous, optionally rectilinear tube material. It is also possible to dispense with the arcuate regions 255. It is also possible for the arcuate regions 255 to have some other geometric configuration, in particular a different radius.

By way of the device 170, shown in FIGS. 1 to 6, with the tube cooler 65 and the electronics housing 10, a device 170 that is formed and can be assembled in a particularly simple manner can be provided. In particular, it is possible here to dispense with particularly expensive soldering steps in the production of the tube cooler 65. Moreover, the tube cooler 65 is able to be plugged particularly easily onto the electronics housing 10 and can likewise be disassembled again particularly easily. Furthermore, as a result of the one-piece configuration, made of a single material, of the tube 70 of the tube cooler 65, tightness problems of the tube cooler 65 are avoided. Furthermore, as a result of the arrangement of the tube cooler 65 on both sides as a result of the tube portions 90, 95 on the top side 15 and as a result of the tube coil 85 on the underside 20, reliable removal of heat from the electronics housing 10 and from the electronics subassembly 55 is ensured. In particular, it is possible as a result to design the electronics 55 independently of the constructive configuration of the electronics housing 10 and of the tube cooler 65, such that the electronics 55 can have components 260 both on the side facing the underside 20 and on the side facing the top side 15.

Furthermore, for the form-fitting connection by means of the fastening means 175, 215, further fastening means can additionally be provided, which clamp the tube cooler 65 to the electronics housing 10. As a result, increased mechanical demands for fixing the tube cooler 65 to the electronics housing 10 can be complied with. It is also possible for this fastening means to be provided as an alternative to the fastening means 175, 215 shown in FIGS. 4 to 6.

By way of the above-described device 170, the number of parts and the assembly effort for two-sided cooling of the electronics housing 10 can be reduced.

Although the invention has been illustrated and described in more detail by way of the preferred exemplary embodiment, the invention is not limited by the disclosed examples and other variations can be derived therefrom by a person skilled in the art without departing from the scope of protection of the invention.

The invention claimed is:

1. A device, comprising:
an electronics housing having a top side and an underside opposite said top side; and
a tube cooler having a tube formed in one piece from a single material, said tube being fillable with a coolant;
said tube having a tube coil, a first tube portion and a first connecting portion;
said first tube portion being connectable to a coolant supply for feeding the coolant, and said first connecting portion fluidically connecting said first tube portion to a first side of said tube coil;
said first tube portion being laterally offset with respect to said tube coil;
said tube coil and said first tube portion extending on a common side of said first connecting portion;
said first connecting portion being inclined with respect to said tube coil and to said first tube portion and/or being curved from said tube coil to said first tube portion;
said electronics housing being disposed between said first tube portion and said tube coil, with said tube coil extending along said underside of said electronics housing and said first tube portion extending along said top side of said electronics housing, and said first connecting portion being guided laterally past said electronics housing.

2. The device according to claim 1, wherein:
said tube has a second tube portion and a second connecting portion;
the second connecting portion fluidically connects said second tube portion to a second side of said tube coil;
said second tube portion is laterally offset with respect to said tube coil;
said tube coil and said second tube portion extend on a common side of said second connecting portion; and
said second connecting portion is inclined with respect to said tube coil and to said second tube portion and/or extends in a curve from said tube coil to said second tube portion.

3. The device according to claim 1, wherein said tube coil is arranged in a first main plane of extent and said first tube portion is arranged in a second main plane of extent, and wherein the first main plane of extent is parallel to the second main plane of extent.

4. The device according to claim 3, wherein said electronics housing is arranged in between said first and second main planes of extent.

5. The device according to claim 3, wherein said second tube portion is arranged in the second main plane of extent.

6. The device according to claim 5, wherein said second tube portion extends parallel to said first tube portion.

7. The device according to claim 3, wherein said first connecting portion and said second connecting portion are arranged at least partially in a common third main plane of extent.

8. The device according to claim 7, wherein said second connecting portion is arranged in said third main plane of extent with an inclination relative to said first connecting portion.

9. The device according to claim 1, wherein said first connecting portion is arranged perpendicularly, at least partially, to said first tube portion and/or at least partially to said tube coil.

10. The device according to claim 1, wherein:
said tube coil has a first tube coil portion, a second tube coil portion and at least one third tube coil portion;
said second tube coil portion fluidically connects said first tube coil portion to said third tube coil portion;
said first tube coil portion is arranged at least partially parallel to said third tube coil portion.

11. The device according to claim 10, wherein:
said second tube coil portion connects said first tube coil portion to said third tube coil portion on a side of said first tube coil portion facing away from said first connecting portion; and
said second tube coil portion is arranged at least partially at right angles to said first tube coil portion and/or to said third tube coil portion.

12. The device according to claim 10, wherein said first tube portion and/or said second tube portion are arranged parallel to said first tube coil portion and/or to said third tube coil portion.

13. The device as claimed in claim 10, wherein:
said first tube coil portion and said third tube coil portion are at a first spacing from one another;
said first tube portion and said second tube portion are at a second spacing from one another; and
said second spacing is different from said first spacing.

14. The device as claimed in claim 13, wherein said second spacing is greater than said first spacing.

15. The device according to claim 1, wherein:
said tube comprises a connection portion;
said connection portion is fluidically connected to said first tube portion, and said connection portion is offset with respect to said first tube portion in a direction of a side facing away from said tube coil.

16. The device according to claim 15, wherein said connection portion is spaced apart from said top side of said electronics housing.

* * * * *